(12) United States Patent
Eftimie et al.

(10) Patent No.: US 7,558,111 B2
(45) Date of Patent: Jul. 7, 2009

(54) NON-VOLATILE MEMORY CELL IN STANDARD CMOS PROCESS

(75) Inventors: Sabin A. Eftimie, jud. Brasov (RO); Ilie Marian I. Poenaru, Bucharest (RO); Sorin S. Georgescu, San Jose, CA (US)

(73) Assignee: Catalyst Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 11/469,840

(22) Filed: Sep. 1, 2006

(65) Prior Publication Data

US 2008/0055965 A1 Mar. 6, 2008

(51) Int. Cl.
*G11C 14/00* (2006.01)

(52) U.S. Cl. ............... 365/185.08; 365/185.14

(58) Field of Classification Search ............. 365/185.08
See application file for complete search history.

(56) References Cited

U.S. PATENT DOCUMENTS

| | | | |
|---|---|---|---|
| 5,189,641 A | 2/1993 | Arakawa | |
| 5,239,500 A * | 8/1993 | Oguey | 365/185.03 |
| 5,272,368 A * | 12/1993 | Turner et al. | 365/185.1 |
| 5,561,621 A * | 10/1996 | Devin et al. | 365/49 |
| 6,775,197 B2 | 8/2004 | Novosel et al. | |
| 6,788,574 B1 | 9/2004 | Han et al. | |
| 6,950,342 B2 | 9/2005 | Lindhorst et al. | |
| 2004/0105301 A1 | 6/2004 | Toyoda et al. | |
| 2004/0252558 A1 | 12/2004 | Umezawa | |
| 2005/0190597 A1* | 9/2005 | Kato | 365/185.08 |

* cited by examiner

*Primary Examiner*—Huan Hoang
*Assistant Examiner*—Jason Lappas
(74) *Attorney, Agent, or Firm*—Bever, Hoffman & Harms, LLP; E. Eric Hoffman

(57) ABSTRACT

A non-volatile memory cell fabricated with a conventional CMOS process, including a flip-flop circuit having an NMOS transistor that shares a floating gate with a write PMOS capacitor and an erase PMOS capacitor. An erase function is implemented by inducing Fowler-Nordheim tunneling through the erase PMOS capacitor, thereby providing a positive charge on the floating gate. A write function is implemented by inducing Fowler-Nordheim tunneling through the NMOS transistor, thereby providing a negative charge on the floating gate. The write PMOS capacitor provides bias voltages during the erase and write operations. Prior to a read operation, the flip-flop circuit is reset. If the floating gate stores a positive charge, the NMOS transistor turns on, thereby switching the state of the flip-flop circuit. If the floating gate stores a negative charge, the NMOS transistor turns off, thereby leaving the flip-flop circuit in the reset state.

18 Claims, 4 Drawing Sheets

NON-VOLATILE MEMORY CELL IN STANDARD CMOS PROCESS

BACKGROUND OF THE INVENTION

1. Technical Field

The present invention is in the field of non-volatile programmable integrated circuits using standard CMOS technology.

2. Related Art

FIG. 1 is a circuit diagram of a conventional differential floating gate non-volatile memory circuit 100, which includes p-channel (PMOS) field effect transistors 101-105 and differential sense amplifier 106. Non-volatile memory circuit 100 uses a differential configuration, wherein a data bit is represented by the charge stored on the two floating nodes FG0 and FG1. Non-volatile memory circuit 100 is described in more detail in U.S. Pat. No. 6,950,342. Non-volatile memory circuit 100 is a complex circuit that requires a large per-bit layout area. Moreover, non-volatile memory circuit 100 requires at least 4-5 current branches to enable program, erase and read operations. Finally, non-volatile memory circuit 100 does not provide for a margin read operation to test the reliability of the circuit. Consequently, memory circuit 100 will exhibit low reliability/quality.

FIG. 2 is a cross sectional view of a conventional electrically-alterable non-volatile memory cell 200, which includes a coupling capacitor 202, a read transistor 204, and a tunneling capacitor 206. The coupling capacitor 202 includes a first gate 208, a first P+ doped region 210, a first N+ doped region 218, a first spacer 230, a second spacer 232, an insulating material 228, an N+ doped well region 234, N+ contacts 245 and P+ contacts 246. Coupling capacitor 202 is isolated by trench isolations 236 and 238. The tunneling capacitor 206 includes a second gate 226, a second N+ doped region 224, a second P+ doped region 222, a third spacer 246, a fourth spacer 248, insulating material 228, N+ doped well region 234, N+ contacts 250 and P+ contacts 251. Tunneling capacitor 206 is isolated by shallow trench isolations 240 and 242. The read transistor 204 includes a third gate 220, a third N+ region 252, a fourth N+ region 254, a fifth spacer 256, a sixth spacer 260, insulating material 228, P-substrate 244, a drain terminal 262 and a source terminal 264. Non-volatile memory cell 200 is described in more detail in U.S. Pat. No. 6,788,574 (the '574 patent).

The fabrication of non-volatile memory cell 200 requires the formation of gates 208 and 226, which are each composed of both N+ doped material 259 and P+ doped material 258. Formation of the P+ doped regions 258 of gates 208 and 226 requires a process more complicated than a standard CMOS process. In addition, the '574 patent does not provide for a margin read operation to test the reliability of non-volatile memory cell 200. (Indeed, the '574 patent does not provide details of the read circuitry used to access non-volatile memory cell 200.) Consequently, non-volatile memory cell 200 will exhibit low reliability/quality.

FIG. 3 is a circuit diagram of a conventional non-volatile memory element 300, includes access transistor 302, writing capacitor 304 and anti-fuse element 306. Non-volatile memory element is programmed by shorting the gate oxide of anti-fuse element 306. Non-volatile memory element 300 implements destructive (one-time only) programming, which severely limits the use of this element. Moreover, shorting the gate oxide typically requires significant current and power consumption. Non-volatile memory element 300 is described in more detail in U.S. Pat. No. 6,775,197.

It would therefore be desirable to have a non-volatile memory cell that overcomes the above-described deficiencies of conventional non-volatile memory systems. More specifically, it would be desirable to have a non-volatile memory system that can be fabricated using a conventional CMOS process, does not require excessive layout area, provides for a margin read operation, is reprogrammable, and minimizes power consumption.

SUMMARY

Accordingly, the present invention provides a reprogrammable non-volatile memory cell fabricated with a conventional CMOS process. The non-volatile memory cell includes a flip-flop circuit having an NMOS transistor that shares a floating gate with a write PMOS capacitor and an erase PMOS capacitor. An erase function is implemented by inducing Fowler-Nordheim tunneling through the erase PMOS capacitor, thereby providing a positive charge on the floating gate. A write function is implemented by inducing Fowler-Nordheim tunneling through the NMOS transistor, thereby providing a negative charge on the floating gate.

To perform a read operation, the flip-flop circuit is reset to a first logic state. If the floating gate has been erased to store a positive charge, the NMOS transistor will turn on in response to this stored positive charge, thereby switching the state of the flip-flop circuit to a second logic state. Conversely, if the floating gate has been programmed to store a negative charge, the NMOS transistor will be turned off in response to this negative charge, thereby leaving the flip-flop circuit in the first logic state. No current paths exist during the read operation, thereby minimizing power consumption during the read operation.

A current injection circuit can be provided to inject read margin current into the flip-flop circuit, thereby providing a means for performing a read margin test on the non-volatile memory cell of the present invention.

The present invention will be more fully understood in view of the following description and drawings.

DETAILED DESCRIPTION

Figure 1:
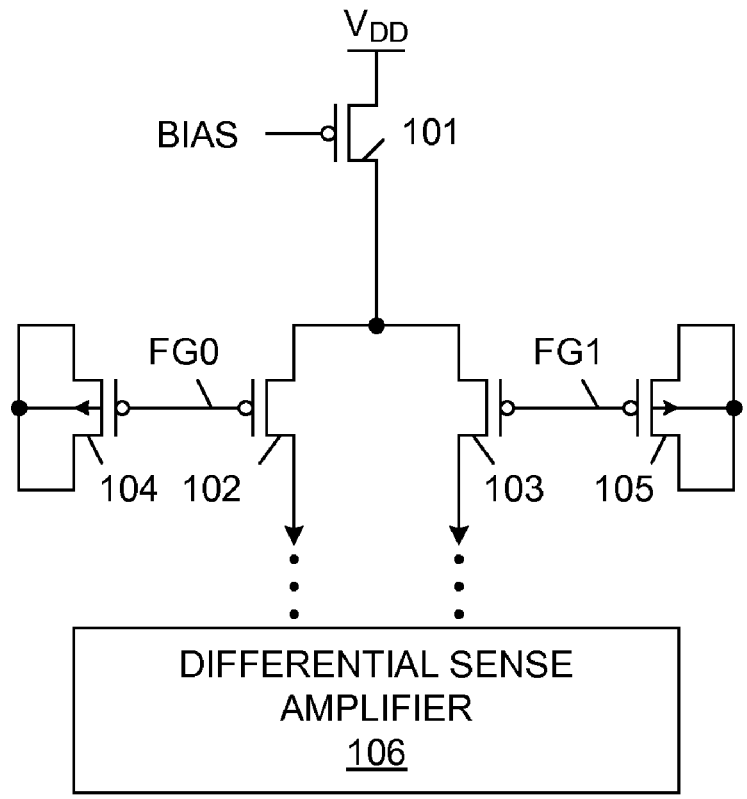
FIG. 1 is a circuit diagram of a conventional differential floating gate non-volatile memory circuit.
Figure 3:
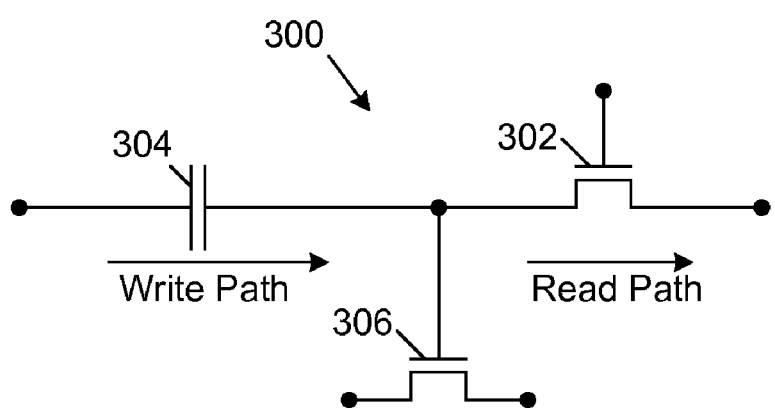
FIG. 3 is a circuit diagram of a conventional one-time programmable non-volatile memory element.
Figure 2:
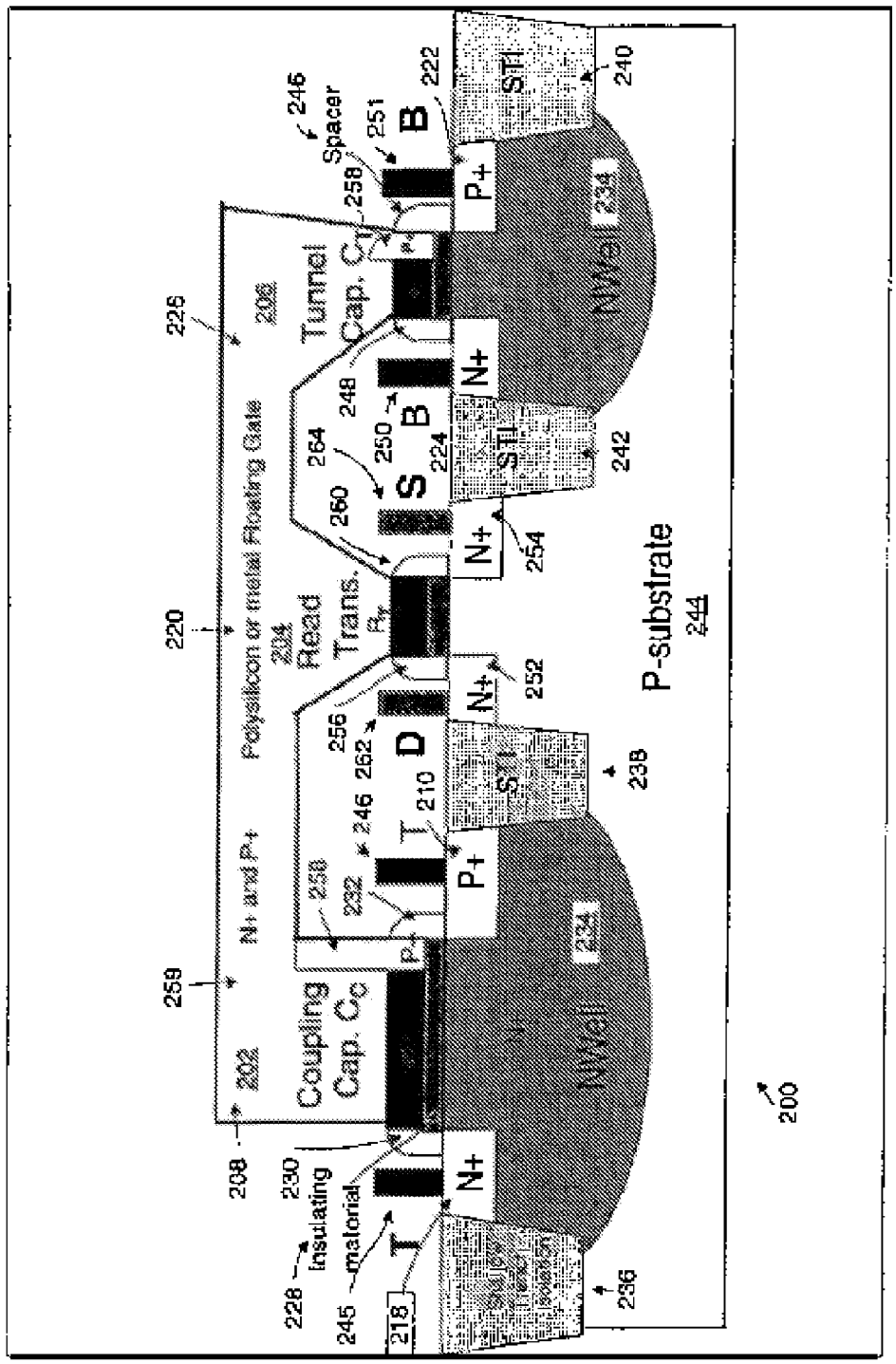
FIG. 2 is a cross sectional view of a conventional electrically-alterable non-volatile memory cell.
Figure 4:
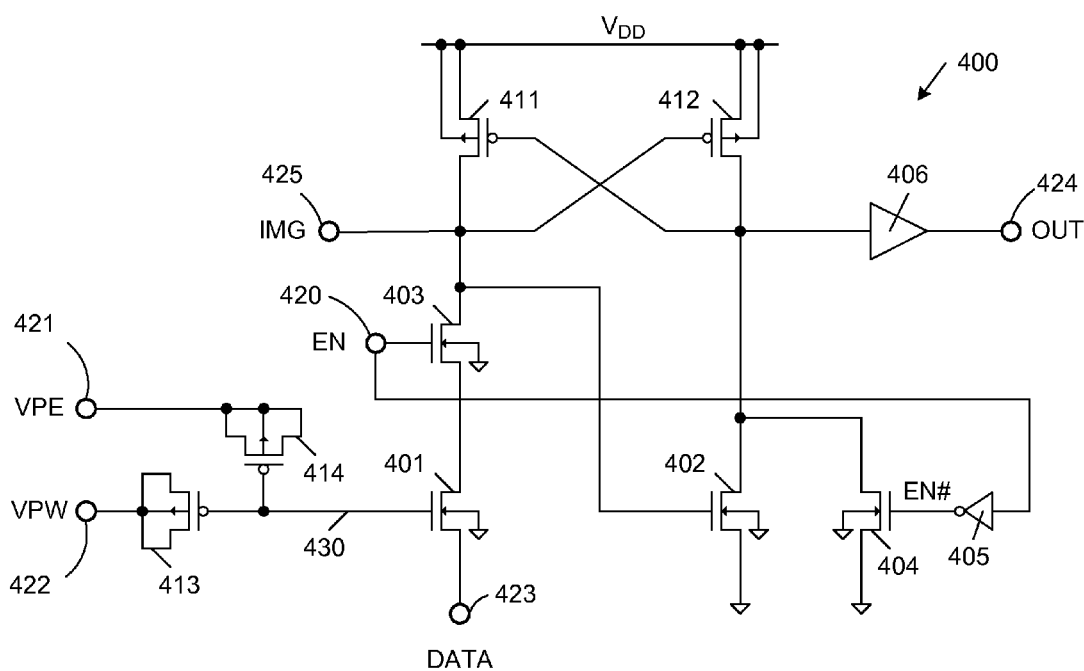
FIG. 4 is a circuit diagram of a non-volatile memory cell in accordance with one embodiment of the present invention.

FIG. 4 is a circuit diagram of a non-volatile memory (NVM) cell 400 in accordance with one embodiment of the present invention. NVM cell 400 includes n-channel (NMOS) field effect transistors 401-404, inverter 405, output buffer 406, p-channel (PMOS) field effect transistors 411-414 and signal nodes 420-425.

The sources and n-type body regions of p-channel transistors 411 and 412 are commonly connected to receive a positive supply voltage $V_{DD}$. The gate of p-channel transistor 412 is coupled to the drain of p-channel transistor 411, current injection node 425, and the gate of n-channel transistor 402.

The gate of p-channel transistor 411 is coupled to the drain of p-channel transistor 412, the drains of n-channel transistors 402 and 404, and the input terminal of output buffer 406. The output terminal of output buffer 406 is coupled to NVM cell output node 424.

N-channel transistors 401 and 403 are connected in series between the drain of p-channel transistor 411 and data input node 423. The gate of n-channel transistor 403 is coupled to receive a cell enable signal (EN) from cell enable node 420. N-channel transistor 402 is coupled in series between the drain of p-channel transistor 412 and ground. N-channel transistor 404 is also coupled in series between the drain of p-channel transistor 412 and ground (in parallel with n-channel transistor 402). The gate of n-channel transistor 404 is coupled to the output terminal of inverter 405, and the input terminal of inverter 405 is coupled to cell enable node 420. The p-type body regions of n-channel transistors 401-404 are all coupled to ground.

N-channel transistor 401 includes a floating gate electrode 430, which is shared with p-channel transistors 413 and 414. Floating gate electrode 430 is delimited by the gate oxides of n-channel transistor 401 and p-channel transistors 413-414. The source, drain and body regions of p-channel transistor 414 are commonly coupled to erase control terminal 421, such that this transistor 414 forms a PMOS capacitive element between erase control node 421 and floating gate electrode 430. Similarly, the source, drain and body regions of p-channel transistor 413 are commonly coupled to write control terminal 422, such that transistor 413 forms a PMOS capacitive element between write control node 422 and floating gate electrode 430. The area ratio between transistor 413 and transistor 414 is selected to be at least 100:1. The gate area of PMOS capacitor 413 is selected to be at least 100 times greater than the gate area of n-channel transistor 401. For gate oxides thin enough, floating gate electrode 430 can be charged/discharged with electrons by applying high voltages on erase control node 421 and on write control node 422.

It is important to note that NVM cell 400 only requires a single gate electrode layer (e.g., polysilicon layer). That is, the gate electrodes of all of the transistors of NVM cell 400 are formed by patterning the same layer. This layer is typically polycrystalline silicon, which is conductively doped before or after the patterning step. Because NVM cell 400 only requires a single gate electrode layer, NVM cell 400 can be fabricated using a conventional CMOS logic process.

In a non-preferred alternate embodiment (which does not implement conventional CMOS processing steps), p-channel transistor 413 is replaced by a capacitor having plates formed from a first gate layer and a second overlying gate layer.

Non-volatile memory cell 400 operates as follows in accordance with one embodiment of the present invention. In general, NVM cell 400 implements a flip-flop structure, which is formed by NMOS transistors 401-402 and PMOS transistors 411-412. The output of this flip-flop structure is coupled to the input of buffer 406, such that this buffer 406 provides an output signal (OUT) on output node 424. NMOS transistors 403 and 404 operate as switches to facilitate start-up and programming operations of NVM cell 400. NMOS transistor 403 is controlled by the cell enable signal (EN) applied to enable node 420. NMOS transistor 404 is controlled by the inverse of the enable signal (i.e., EN#), as provided by inverter 405. Write, erase and read operations are performed in response to an erase control voltage (VPE) applied to erase control node 421, a write control voltage (VPW) applied to write control node 422, and a data signal (DATA) applied to input data node 423.

Non-volatile memory cell 400 is programmed using two functions, namely, an erase function and a write function. The process of establishing a positive charge on floating gate electrode 430 is hereinafter referred to as an erase function. Conversely, the process of establishing a negative charge on floating gate electrode 430 is hereinafter referred to as a write function.

The erase function is performed prior to the write function, such that a positive charge is established on the floating gate electrode of each non-volatile memory cell subject to programming.

An erase function is implemented as follows. A high positive erase control signal VPE (e.g., 14 Volts) is applied to erase control node 421. The cell enable signal EN is selected to turn off n-channel transistor 403 (e.g., EN=0 Volts). The input data node 423 and the write enable node 422 are both grounded (i.e., DATA=VPW=0 Volts). Under these conditions, PMOS capacitors 413 and 414 form a capacitive divider circuit between erase control node 421 and write control node 422. Because the area ratio between PMOS capacitor 413 and PMOS capacitor 414 is at least 100:1, the potential of floating gate electrode 430 remains low. The voltage drop across the gate oxide of capacitor 414 is high enough to discharge electrons from floating gate electrode 430 (to erase control node 421) by Fowler-Nordheim tunneling. Removing electrons from floating gate electrode 430 leaves a net positive charge on this electrode 430.

After the erase function has been implemented, the write function is then performed. Within non-volatile memory cell 400, the write function can selectively: (1) remove the positive charge previously established on floating gate electrode 430, or (2) leave the positive charge remaining on floating gate electrode 430.

A write function is implemented as follows. A high positive voltage (e.g., 14 Volts) is applied to erase control node 421 and write control node 422. In the present example, erase control signal VPE and write control signal VPW are both controlled to have a potential of 14 Volts. Because the gate area of n-channel transistor 401 is at least 100 times smaller than the area of PMOS capacitor 413, the potential of floating gate electrode 430 will increase to approximately the potential of the write control signal VPW plus the potential of the initial positive charge stored on floating gate electrode 430. N-channel transistor 403 is turned off during the time that the write function is being implemented. N-channel transistor 403 can be turned off, for example, by grounding cell enable node 420.

The voltage of the DATA signal determines whether or not electrons are injected into floating gate electrode 430 during the write function. If the DATA signal applied to input data node 423 is selected to be 0 Volts, then the voltage across the gate oxide of n-channel transistor 401 is sufficiently high for electrons to be injected into floating gate electrode 430 by Fowler-Nordheim tunneling. As a result, a net negative charge is introduced to floating gate electrode 430.

However, if the DATA signal applied to input data node 423 is selected to have a potential of at least 5 Volts, then the voltage across the gate oxide of n-channel transistor 401 is not high enough to induce Fowler-Nordheim tunneling. As a result, the positive charge introduced to floating gate electrode 430 during the erase function is preserved.

Non-volatile memory cell 400 is read in the following manner. The charge on floating gate electrode 430 is stored even if power is removed from non-volatile memory cell 400. Thus, the contents of non-volatile memory cell must be reliably read during start-up of the integrated circuit chip on which non-volatile memory cell 400 is fabricated.

At start-up, the cell enable node 420 is grounded, such that cell enable signal EN has a logic '0' state. The logic '0' state of the cell enable signal EN turns off n-channel transistor 403. Inverter 405 provides an EN# signal having a logic '1' state, thereby turning on n-channel transistor 404. Under these conditions, the input of buffer 406 is pulled down to ground (through n-channel transistor 404), thereby causing buffer 406 to initially provide an output signal OUT having a logic '0' state, regardless of the charge stored on floating gate electrode 430.

The $V_{DD}$ supply voltage increases from an initial low voltage during start-up. When the $V_{DD}$ supply voltage increases to a voltage greater than a transistor threshold voltage, p-channel transistor 411 turns on, because the gate of p-channel transistor 411 is grounded (through turned on transistor 404). As a result, the $V_{DD}$ supply voltage is applied to the gate of p-channel transistor 412 and the gate of n-channel transistor 402 (through turned on p-channel transistor 411). In response, p-channel transistor 412 turns off, and n-channel transistor 402 turns on. At this time, n-channel transistors 402 and 404 are both pulling down the voltage on the input terminal of buffer 406.

In addition, when the $V_{DD}$ supply voltage increases to a voltage greater than a transistor threshold voltage, the cell enable signal EN is controlled to transition to a logic '1' value, thereby turning on n-channel transistor 403 (and turning off n-channel transistor 404). This function is normally provided by the power-on-reset (POR) signal, which is already available in most circuits. Input data node 423, erase control node 421 and write control node 422 are all grounded.

If floating gate electrode 430 has been programmed to store a negative charge, the potential of floating gate electrode 430 will be less than the threshold voltage of n-channel transistor 401. In this case, n-channel transistor 401 is off (non-conductive), thereby allowing n-channel transistor 402 and p-channel transistor 411 to remain turned on, and causing p-channel transistor 412 to remain turned off. Under these conditions, the output signal OUT remains in the logic "0" state.

However, if floating gate electrode 430 has been programmed to store a positive charge, the potential of floating gate electrode 430 will be greater than the threshold voltage of n-channel transistor 401. In this case, n-channel transistor 401 will turn on, thereby coupling the gate of p-channel transistor 412 and the gate of n-channel transistor 402 to ground. N-channel transistor 401 is designed to be stronger than n-channel transistor 402 and p-channel transistors 411 and 412. That is, when n-channel transistor 401 turns on, the resulting voltage applied to the gate of n-channel transistor 402 is sufficient to turn off this transistor 402. It is important to note that the cell enable signal 420 is controlled to transition to a logic "1" value while the $V_{DD}$ supply voltage is at the relatively low transistor threshold voltage, (e.g., around 1 to 2 Volts when using a standard 3.3 Volt CMOS process). This helps to ensure that n-channel transistor 401 is stronger than p-channel transistor 411 at the time that n-channel transistor 403 is switched on.

In addition, the ground voltage applied to the gate of p-channel transistor 412 causes this transistor to turn on. Once turned on, p-channel transistor 412 routes the $V_{DD}$ supply voltage to output buffer 406, thereby causing output buffer 406 to provide an OUT signal having a logic "1" value. P-channel transistor 412 also routes the $V_{DD}$ supply voltage to the gate of p-channel transistor 411, thereby turning off this transistor 411. Note that the read operation does not require any current paths, thereby minimizing the power consumption of memory system 400 during read operations.

In addition to the above-described erase, write and read functions, non-volatile memory cell 400 can also implement a margin read function. The margin read function is used to determine how strongly non-volatile memory cell 400 is programmed. Because of the architecture of non-volatile memory cell 400, the margin read function is only required if memory cell 400 is programmed to provide a logic '1' output signal. If memory cell 400 is programmed to provide a logic '0' output signal, the programmed state of the memory cell will never switch because of charge loss on floating gate electrode 430.

The margin read function is implemented by injecting a current (IMG) into margin read current node 425. When the injected current IMG becomes greater than the current that n-channel transistor 401 can sink, the gate voltage of p-channel transistor 412 will increase, until p-channel transistor 412 is turned off and n-channel transistor 402 is turned on. At this time, the flip-flop circuit will switch, and the output signal OUT will transition to a logic '0' state. The value of the injected current at the time the output signal OUT transitions to a logic '0' state provides a measurement of the positive charge stored on floating gate electrode 430.

Figure 5:
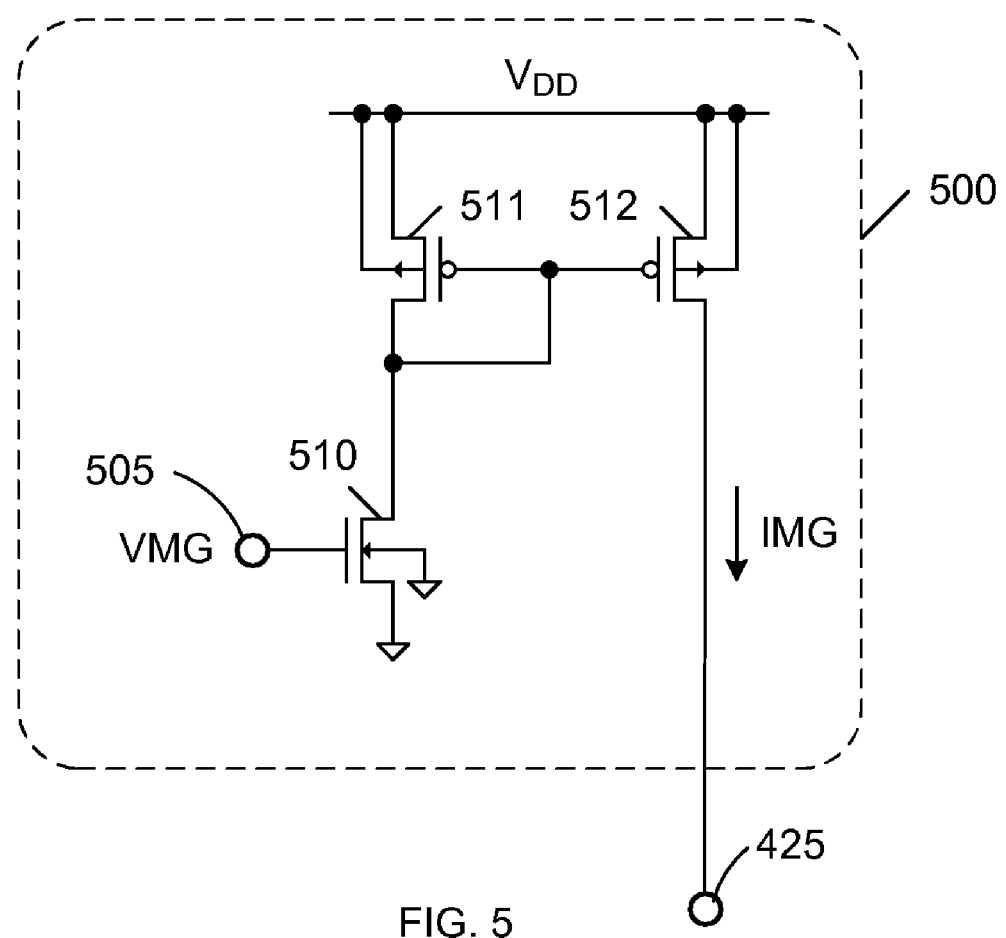
FIG. 5 is a circuit diagram of a read margin current injection circuit in accordance with one embodiment of the present invention.

FIG. 5 is a circuit diagram of a read margin current injection circuit 500 in accordance with one embodiment of the present invention. Current injection circuit 500 includes read margin voltage node 505, n-channel transistor 510 and p-channel transistors 511-512, which are arranged in a current mirror configuration. Current injection circuit 500 produces the read margin current IMG injected into read current margin node 425.

N-channel transistor 510 is identical to n-channel transistor 401. The current through n-channel transistor 510 is controlled by the potential on read margin voltage node 505. The current through transistor 510 is copied as the read margin current IMG by the current mirror formed by p-channel transistors 511 and 512. P-channel transistors 511 and 512 have a width-to-length (W/L) ratio much greater than the W/L ratio of p-channel transistor 411. As a result, the current injected by p-channel transistor 411 is negligible in comparison with the IMG current injected by p-channel transistor 512 (i.e., the current through n-channel transistor 510). The flip-flop circuit implemented within non-volatile memory cell 400 will switch when the read margin voltage VMG applied to node 505 is close to or greater than the potential of floating gate electrode 430. Thus, the read margin voltage is equal to the minimum read margin voltage applied to node 505 that causes the output signal (OUT) of non-volatile memory cell 400 to switch from a logic '1' state to a logic '0' state.

As mentioned above, an alternate version of memory cell 400 can be realized by replacing p-channel transistor 413 with a capacitor having plates formed from a first gate layer (e.g., poly-1) and a second overlying gate layer (e.g., poly-2). Such a capacitor will have a thicker oxide than the conventional gate oxide used in p-channel capacitor 413. Note that the poly-1/poly-2 capacitor can be used because this device will never implement tunneling during an erase function or a write function. The only devices to implement tunneling are p-channel capacitor 414 (during an erase function) and n-channel transistor 401 (during a write function).

Although the present invention has been described in connection with several embodiments, it is understood that this invention is not limited to the embodiments disclosed, but is capable of various modifications and embodiments which would be apparent to one of ordinary skill in the art. It is, therefore, contemplated that the appended claims will cover any such modifications or embodiments as falling within the true scope of the invention.

We claim:

1. A non-volatile memory cell comprising:
   a flip-flop circuit including a first MOS transistor having a first conductivity type, the first MOS transistor having a gate, a drain and a source, wherein the source is coupled to receive a write data value;
   a first capacitor structure coupled to the gate of the first MOS transistor; and
   a second capacitor structure coupled to the gate of the first MOS transistor, wherein the first MOS transistor, the first capacitor structure and the second capacitor structure share a common floating gate electrode.

2. The non-volatile memory cell of claim 1, wherein the first capacitor structure comprises a MOS transistor having a second conductivity type, opposite the first conductivity type.

3. The non-volatile memory cell of claim 2, wherein the second capacitor structure comprises a MOS transistor having the second conductivity type.

4. The non-volatile memory cell of claim 2, wherein the second capacitor structure comprises a second gate electrode located over the floating gate electrode.

5. The non-volatile memory cell of claim 1, wherein the second capacitor structure has an area at least 100 times greater than the first capacitor structure.

6. The non-volatile memory cell of claim 5, wherein the second capacitor structure has an area at least 100 times greater than the area of the gate of the first MOS transistor.

7. The non-volatile memory cell of claim 1, further comprising a second MOS transistor having the first conductivity type, wherein the second MOS transistor is configured to reset the flip-flop circuit during start-up of the non-volatile memory cell.

8. The non-volatile memory cell of claim 7, further comprising a third MOS transistor having the first conductivity type, wherein the third MOS transistor is configured to isolate the first MOS transistor from the rest of the flip-flop circuit during start-up of the non-volatile memory cell.

9. The non-volatile memory cell of claim 1, further comprising a current injection circuit coupled to the flip-flop circuit and forming a current mirror with the first MOS transistor, wherein the current injection circuit is configured to identify a read margin of the non-volatile memory cell.

10. A method of operating a non-volatile memory cell, comprising:
    establishing a positive charge on a floating gate shared by a first MOS transistor having a first conductivity type, a first capacitor structure and a second capacitor structure, wherein the first MOS transistor is included in a flip-flop circuit, and wherein the positive charge is established by:
    isolating the first MOS transistor from a plurality of other MOS transistors in the non-volatile memory cell;
    coupling the first capacitor structure to a ground supply terminal; and
    coupling the second capacitor structure to a positive voltage supply terminal, wherein electrons are removed from the floating gate by Fowler-Nordheim tunneling through the second capacitor structure.

11. The method of claim 10, further comprising removing the positive charge previously established on the floating gate by:
    isolating the first MOS transistor from the plurality of other MOS transistors in the non-volatile memory cell;
    coupling the first and second capacitor structures to a positive voltage supply terminal; and
    coupling the first MOS transistor to the ground supply terminal, wherein electrons are injected into the floating gate by Fowler-Nordheim tunneling through the first MOS transistor.

12. The method of claim 11, further comprising reading the non-volatile memory cell by:
    coupling the first MOS transistor to the plurality of other MOS transistors in the non-volatile memory cell; and
    providing an output of the non-volatile memory cell in response to the charge on the floating gate.

13. The method of claim 12, wherein the step of reading further comprises:
    initially setting the output of the non-volatile memory cell; and
    switching the output of the non-volatile memory cell only if the floating gate stores a positive charge.

14. The method of claim 10, further comprising forming the first capacitor structure with a MOS transistor having a second conductivity type, opposite the first conductivity type.

15. The method of claim 11, further comprising forming the second capacitor structure with a MOS transistor having the second conductivity type.

16. The method of claim 10, further comprising selecting the area of the second capacitor structure to be at least 100 times greater than the area of the first capacitor structure.

17. The method of claim 16, further comprising selecting the area of the second capacitor structure to be at least 100 times greater than a gate area of the first MOS transistor.

18. The method of claim 10, further comprising a injecting current into the first MOS transistor to determine a read margin of the non-volatile memory cell.

* * * * *